United States Patent [19]

Shirata et al.

[11] Patent Number: 5,091,043
[45] Date of Patent: * Feb. 25, 1992

[54] METHOD FOR MONOCRYSTALINE GROWTH OF DISSOCIATIVE COMPOUND SEMICONDUCTORS

[75] Inventors: Keiji Shirata; Koichi Sassa; Kenji Tomizawa, all of Omiya, Japan

[73] Assignee: Mitsubishi Materials Corporation, Tokyo, Japan

[ * ] Notice: The portion of the term of this patent subsequent to Dec. 24, 2008 has been disclaimed.

[21] Appl. No.: 395,718

[22] Filed: Aug. 18, 1989

[30] Foreign Application Priority Data

Aug. 19, 1988 [JP] Japan .................................. 63-205860
Aug. 19, 1988 [JP] Japan .................................. 63-205862
May 16, 1989 [JP] Japan .................................. 1-122630

[51] Int. Cl.$^5$ .......................................... C30B 15/22
[52] U.S. Cl. ................................. 156/601; 156/607; 156/617.1; 156/618.1; 156/620.2; 156/DIG. 70; 422/249
[58] Field of Search ................. 156/601, 607, 617.1, 156/618.1, 620.2, DIG. 70; 422/249, 112

[56] References Cited

U.S. PATENT DOCUMENTS

| | | | |
|---|---|---|---|
| 4,008,387 | 2/1977 | Green et al. | 156/601 |
| 4,032,389 | 6/1977 | Joyce | 156/601 |
| 4,565,598 | 1/1986 | Seymour | 156/60.1 |
| 4,586,979 | 5/1986 | Katsumata et al. | 156/607 |
| 4,596,700 | 6/1986 | Tada et al. | 156/DIG. 83 |
| 4,704,257 | 3/1987 | Tomizawa et al. | 422/249 |

FOREIGN PATENT DOCUMENTS

| | | | |
|---|---|---|---|
| 2516197 | 10/1976 | Fed. Rep. of Germany | 156/601 |
| 60-255692 | 12/1985 | Japan | 156/617.1 |
| 61-205697 | 9/1986 | Japan | 156/617.1 |
| 62-7695 | 1/1987 | Japan | 156/617.1 |

OTHER PUBLICATIONS

Bardsley et al, "The Weighing Method of Automatic Czochralski Crystal Growth," Journal of Crystal Growth, vol. 40, No. 1 (1977), pp. 21-28.

Primary Examiner—Robert Kunemund
Attorney, Agent, or Firm—Cushman, Darby & Cushman

[57] ABSTRACT

The present invention relates to a method and apparatus for mono-crystalline growth of a dissociative compound semiconductor. The method, which is based on the Czochralski method, includes the following steps. First, a first volatile component material and second material of the dissociative compound semiconductor are prepared. The first material is placed on the bottom of an inner air-tight vessel which is contained in the outer air-tight vessel. The second material is contained in a crucible in the inner vessel. The crucible is supported by a lower shaft extending from the inside to outside of the inner vessel. The first material is, next, heated for evaporating so as to react with the second material in the crucible. Therefore, the dissociative compound semiconductor is synthesized in the crucible. Then, a single crystal is pulled up from the melt by an upper shaft. The upper shaft extends from inside to outside of the inner vessel, thereby the single crystal is grown. The improvement is that the pulling-up process includes the steps of, after the heating step: measuring the weight of the melt in the crucible, the weight of the melt being influenced by a difference between the interior pressure of the inner vessel and a pressure outside of the inner vessel; correcting the measured weight of the melt for the error due to the pressure difference, thereby obtaining an accurate data of the weight of the melt; and controlling at least one of a composition and a diameter of the growing crystal on the basis of the weight data of the melt.

17 Claims, 3 Drawing Sheets

METHOD FOR MONOCRYSTALINE GROWTH OF DISSOCIATIVE COMPOUND SEMICONDUCTORS

BACKGROUND OF THE INVENTION

The present invention relates to a method and apparatus to grow a single crystal of a dissociative compound semiconductor, controlling the pressure of a volatile component gas. Dissociative compound semiconductor includes, for example, III–V group compounds such as GaAs, InP, or GaP which are compounds of a volatile component (Vth group such as As or P) and a nonvolatile second component (IIIrd group such as Ga or In). GaAs is taken hereinafter as an example, but the present invention is possible to apply for other dissociative compounds.

Japanese Patent Application Publication (kokai) No. 60-255692 discloses an example of an apparatus which is used in the Czochralski method for mono-crystalline growth of a dissociative compound semiconductor.

With reference to FIG. 1, the apparatus of the Japanese Application Publication for mono-crystalline growth has an inner air-tight vessel constituted by an upper vessel portion 1 with an observation scope 9 and a furnace 10 for controlling arsenic gas pressure, and a lower vessel portion 2. A circumferential joint portion 3, at which the upper vessel portion 1 and lower vessel portion 2 are joined, contains sealing material 7 such as $B_2O_3$ which can be melted as a liquid seal at high temperature. Heaters 11 are installed so as to surround the air-tight vessel.

The inner vessel is supported on a pushing-up shaft 13 and a coil spring 8 which is inserted intermediately in the pushing-up shaft 13. A lower shaft 14 is installed through the pushing-up shaft 13, and has a crucible 4 which is laid on the end of the lower shaft 14. An upper shaft 5 penetrates an upper wall of the upper vessel portion 1.

Sealing portions 15 to keep the vessel air-tight are installed at a portion at which the upper shaft 5 slides through the upper vessel portion 1; and at a portion at which the lower shaft 14 slides through the lower vessel portion 2, so that the atmosphere within the inner vessel is isolated from the outer atmosphere. The sealing portions 15 consist of material such as $B_2O_2$ which can be melted at high temperature.

With such construction, gallium is placed in the crucible 4. The whole apparatus is then evacuated and the inner vessel is sealed by pushing up the lower vessel portion 2. The heaters 11 are next turned on to vaporize the arsenic. Then, the temperature of the furnace 10, at which temperature is lowest on the inner vessel wall, is adjusted so that the vessel is filled with arsenic gas at a prescribed pressure. Arsenic gas reacts with gallium in the crucible 4, thereby GaAs melt is produced in the crucible 4.

A GaAs seed fixed at an end of the upper shaft 5 is dipped into the GaAs melt. The upper shaft 5 is pulled up while rotation of the shaft 14 about its axis. Consequently, a single crystal 6 of GaAs can be obtained.

During pulling up the upper shaft 5, a load cell (not shown) which is connected to the upper shaft 5 detects the change in the weight of the single crystal 6. The change of the weight is transmitted to a computer (not shown), which controls the power of the heaters 11 so as to control the diameter of the growing single crystal.

During pulling up the upper shaft 5, the composition of the GaAs melt in the crucible 4 is controlled by the controlling the temperature of the furnace 10.

The control of the composition of the GaAs melt, the result of the reaction of the gallium and arsenic, is very significant. However, in the above method, there is no means to detect the composition ratio of the GaAs melt. Therefore, many difficult measurements with a GaAs are necessary to know such composition ratio.

Additionally, it has been impossible to detect exactly whether the synthesis reaction is saturated. Therefore, seeding procedure had to be delayed for some indefinite time while the synthesis reaction is occuring. The improvement to detect when the composition ratio becomes suitable has been desired.

Furthermore, a load cell which extends its measuring rod into the inside of the inner vessel receives an extra force from the pressure difference between the inner pressure of the air-tight vessel and the pressure of the outer atmosphere. Such pressure difference arises when the two atmospheres partitioned by the inner vessel wall can not be balanced precisely and when a small periodical change of temperature exists on the inner vessel wall. And the output signal of the load cell corresponds to the summation of the true crystal weight and the extra force due to the pressure difference. If the pressure difference fluctuates, the output signal is spoiled by noise. Therefore, it is impossible to measure accurately the weight of the growing crystal. This disadvantage has made it difficult to control the composition ratio and/or the diameter of the dissociative compound semiconductor crystal.

SUMMARY OF THE INVENTION

In order to solve such problems, it is therefore an object of the present invention to provide a method for mono-crystalline growth of a dissociative compound semiconductor with accurate control of the melt composition of the chemical compound semiconductor, without loss of the air-tightness of the apparatus.

It is another object of the present invention to provide an apparatus for mono-crystalline growth of a dissociative compound semiconductor with accurate control of the melt composition of the chemical compound semiconductor, without loss of the air-tightness of the apparatus.

Another object of the present invention is to provide a method for mono-crystalline growth of a dissociative compound semiconductor with accurate control of the diameter of the growing crystal, without loss of the air-tightness of the apparatus.

Another object of the present invention is to provide an apparatus for mono-crystalline growth of a dissociative compound semiconductor with accurate control of the diameter of the growing crystal, without loss of the air-tightness of the apparatus.

According to the present invention, the method for monocrystaline growth of dissociative compound semiconductor, which is based on the Czochralski method, comprises the following steps:

First, a first volatile component material and second material of the dissociative compound semiconductor are prepared. The first material is placed on the bottom of an air-tight vessel. The second material is contained in a crucible in the air-tight vessel. The crucible is supported by a lower shaft extending from the inside to the outside of the air-tight vessel.

The first material is, next, heated for evaporating so as to react with the second material in the crucible. Therefore, the dissociative compound semiconductor is synthesized in the crucible.

Then, a signal crystal is pulled up from the melt by an upper shaft. The upper shaft extends from inside to outside of the air-tight vessel, thereby the single crystal is grown.

The improvement is that the pulling-up process includes the steps of, after the heating step: measuring the weight of the melt in the crucible, the weight of the melt being influenced by a difference between the interior pressure of the air-tight vessel and a pressure outside of the air-tight vessel; correcting the measured weight of the melt for the error due to the pressure difference, thereby obtaining an accurate data of the weight of the melt; and controlling at least one of a composition and a diameter of the growing crystal on the basis of the weight data of the melt.

The apparatus of the present invention for monocrystaline growth of dissociative compound semiconductor comprises an outer air-tight vessel having a top and bottom wall.

An inner air-tight vessel is placed in the outer vessel. The inner vessel has a top and bottom wall.

A furnace is installed on the inner air-tight vessel for controlling pressure of a gas of a first volatile component material of the dissociative compound semiconductor.

A lower shaft of a circular cross section penetrates air-tightly the bottom walls of the outer and inner vessels in a vertical direction. The lower shaft which has an axis in a vertical direction is movable in a vertical direction and rotatable about the axis thereof.

A crucible, for containing a second material, from which a melt of the dissociative compound is synthesized by reaction with said gas of said first material, is disposed in the inner vessel and supported by the lower shaft.

Heating means are installed, which are adequate to give a desirable temperature distribution on the inner vessel wall.

An upper shaft penetrates air-tightly the top walls of the outer and inner vessels in a vertical direction above the crucible, for pulling the single crystal upward from the melt of the dissociative compound, thereby growing the single crystal. The upper shaft which is of a circular cross section having an axis in a vertical direction is movable in a vertical direction and rotatable about the axis thereof.

A first load cell is disposed on the outer vessel for detecting the weight of the melt in the crucible. The weight of the melt is influenced by the difference between the interior pressure of the inner vessel and the pressure outside of the inner vessel.

A second load cell is disposed on the outer vessel for correcting the weight of the melt for the error due to the pressure difference.

According to the present invention, the first load cell detects the weight of the melt in the crucible, the measured weight being influenced by the pressure difference. The second load cell corrects the measured weight for the error due to the pressure difference. Therefore, the weight of the melt in the crucible is corrected to an accurate value. The composition of the melt and/or the diameter of the growing single crystal can be controlled easily and automatically by controlling the heating means on the basis of the accurate weight-value.

Furthermore, since the weight of the melt can be measured during the process of the direct synthesis and during the growth process, the composition ratio of the melt can be recognized and controlled suitably.

DETAILED DESCRIPTION OF THE PREFERRED EMBODIMENTS

Various preferred embodiments of the present invention will be described hereinafter with reference to the accompanying drawings.

First Embodiment

Figure 1:
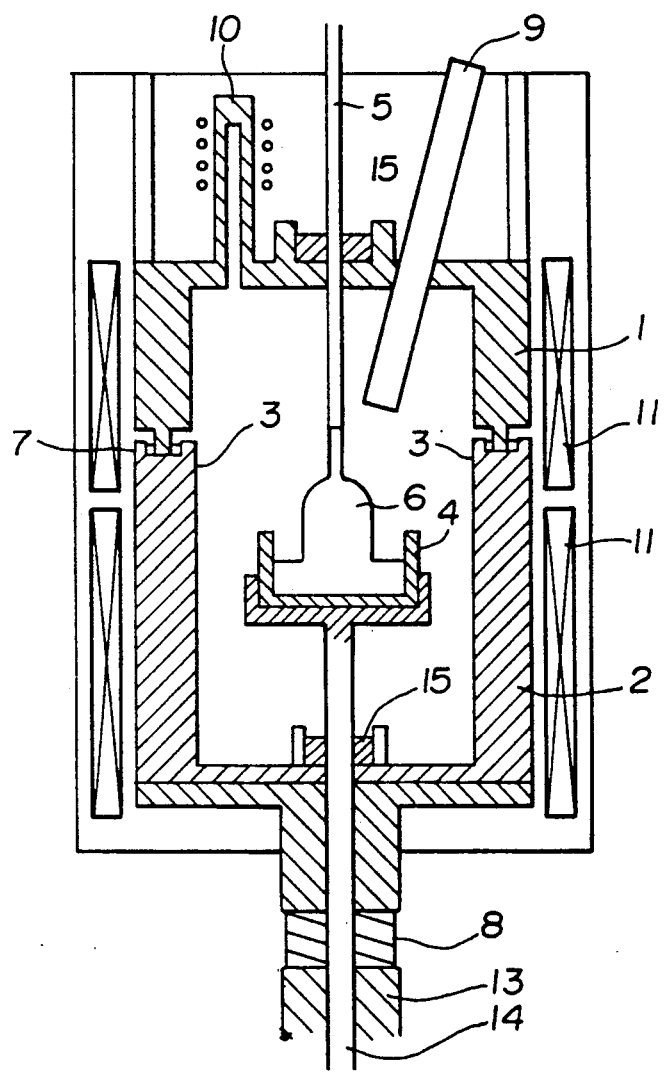
FIG. 1 is a side elevation showing an apparatus of prior art.
Figure 2:
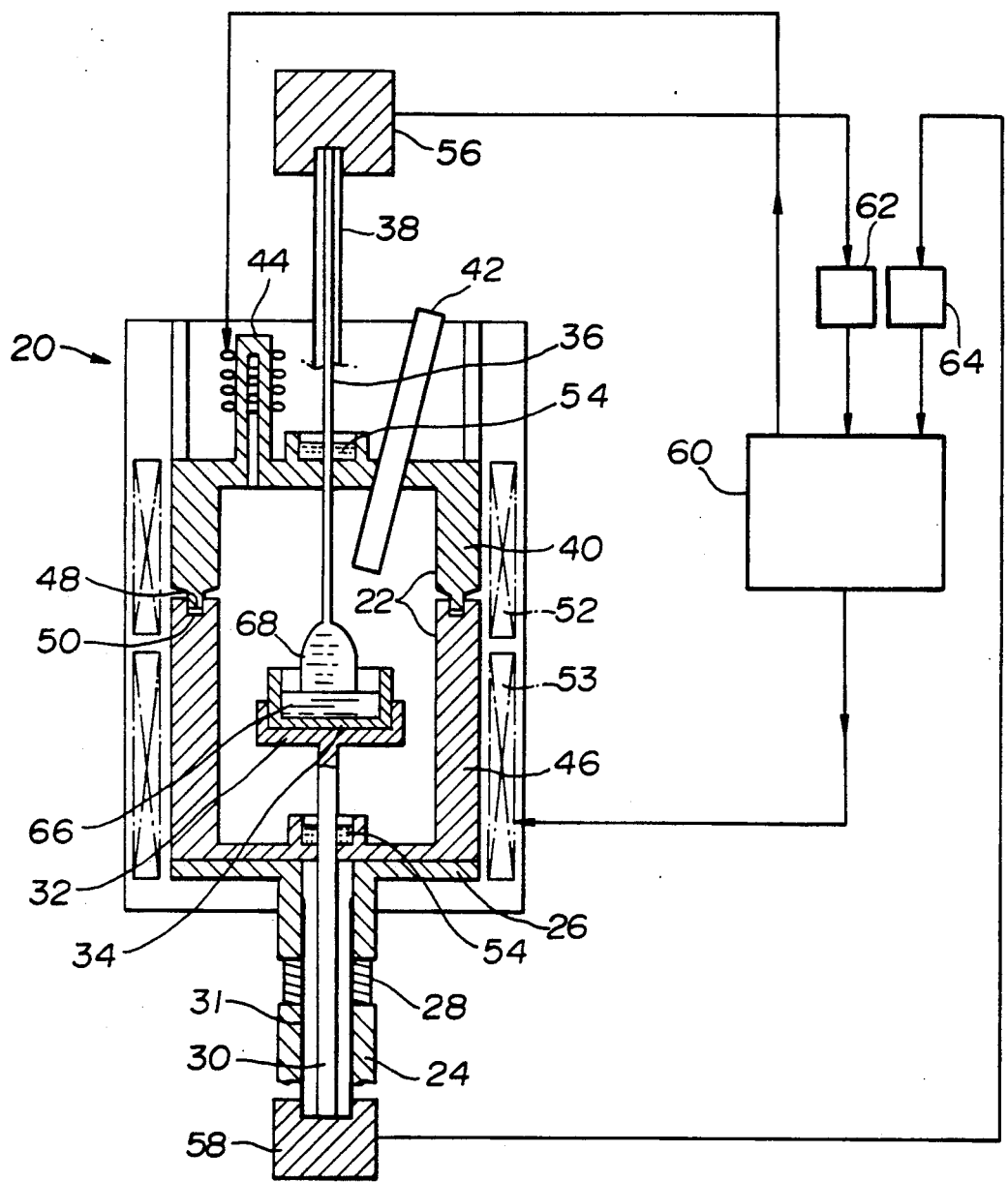
FIG. 2 is a side elevation showing an apparatus of a first embodiment of the present invention.

FIG. 2 depicts an apparatus used for growth of a single crystal of a dissociative compound semiconductor according to a first embodiment of the present invention.

The apparatus comprises an outer vessel 20 closed air-tightly and an inner vessel 22 contained in the outer vessel 20.

The inner vessel 22 is constituted by an upper vessel portion 40 which is installed with an observation scope 42 and a furnace 44 for controlling the arsenic gas pressure, and a lower vessel portion 46. The inner vessel 22 is also closed air-tightly with pushing up the lower vessel portion 46 which is movable in a vertical direction, and joining a joint portion 48 which will be described later on.

A through-hole is formed through a bottom wall of the outer vessel 20. A pushing-up shaft 24 with a flange portion 26 to move the lower portion 46 of the inner vessel 22 is installed in the vertical line in such a manner that a rod portion thereof is inserted slidably and air-tightly in the through-hole of the outer vessel 20; and the flange portion 26 is disposed under the lower portion 46 of the inner vessel 22. The pushing-up shaft 24 has a spring suspension mechanism 28 intermediating in the rod portion thereof.

A lower shaft 30, which is surrounded by a sheath 31, is also inserted through the pushing-up shaft 24 therealong. The lower shaft 30 further extends into the inside of the inner vessel 22 and supports a receptacle 32 which holds a crucible 34. The crucible 34 is able to be located in a desirable position in the inner vessel 22, from the point of view of temperature distribution.

An upper shaft 36 surrounded by a sheath 38 is installed in the vertical line so as to penetrate air-tightly a top (not shown) of the outer vessel 20. An end of the upper shaft 36 extends into the inside of the inner vessel 22.

A circumferential joint portion 48, at which the upper vessel portion 40 and lower vessel portion 46 are joined, contains a sealing material 50 such as $B_2O_3$ which can be melted as a liquid seal at high temperature. Upper and lower heaters 52 and 53 are installed in the outer vessel 20 so as to surround the inner vessel 22.

Sealing portions 54 to give the inner vessel 22 air-tight seals for the movable shafts 30 and 36 are installed at a portion at which the upper shaft 36 slides through the upper vessel portion 40; and at a portion at which the lower shaft 30 slides through the lower vessel portion 46. The sealing portions 54 are also of material such as $B_2O_3$ which can be melted at high temperature. Therefore, the upper shaft 36 and the lower shaft 30 can rotate and move along a vertical direction freely keeping the inner vessel air-tight.

A lower load cell (first load cell) 58 is connected to the lower shaft 30 and the housing of the lower load cell is connected to the sheath 31. Similarly, an upper load cell (second load cell) 56 is connected to the upper shaft 36 and the housing of the upper load cell is connected to the sheath 38. The upper and lower load cells 56 and 58 are connected to a computer 60 via A/D converters 62 and 64, respectively.

Therefore, output signals of the upper and lower load cells 56 and 58 are transmitted to the A/D converters 62 and 64, and converted to digital signals by the A/D converters 62 and 64. The digital signals are received by the computer 60 which calculates the weight of the GaAs melt 66, which will be described later on, in the crucible 34 on the basis of the digital signals. The computer 60 controls the power of the furnace 44 so as to control the composition of the melt.

In the above construction, the upper shaft 36 and lower shaft 30 are of circular cross-sections; and the shafts 30 and 36 may have different diameters or they may have the same diameter.

With such construction, gallium is placed in the crucible 34 and solid arsenic is placed on the bottom of lower vessel portion 46. The whole apparatus is then evacuated. The joint portion 48 is made tight by pressing up the lower vessel portion 46 so as to make inner vessel isolated from the outer atmosphere.

Then, the lower heater 53 and upper heater 52 are turned on to increase the temperature to vaporize the arsenic gas. At the same time, the temperature of the furnace 44 is adjusted so that the inner vessel 22 is filled with arsenic gas at a prescribed pressure, while the outer vessel 20 is filled with an inert gas at a prescribed pressure for balancing the pressure within the inner vessel 22. Arsenic gas reacts with gallium in the crucible 34, thereby GaAs melt 66 is synthesized in the crucible 34.

During the synthesis process, the computer 60 calculates an accurate weight of the GaAs melt 66 on the basis of the output signals of the upper and lower load cells 56 and 58.

The temperature of the As-pressure controlling furnace is adjusted so that the melt 66 has a suitable weight, that means a stoichiometric composition.

A GaAs seed fixed at the lower end of the upper shaft 36 is dipped into the melt 66. The upper shaft 36 is pulled upward with rotation about its axis. Consequently, a single crystal 68 of stoichiometric composition GaAs can be grown.

With such a method, the disadvantage of the conventional method, that is, the inability to detect the composition of the GaAs melt, is solved, so that the composition of the growing single crystal of chemical compound semiconductor is accurately controlled. Furthermore, the weight of the melt 66 can be measured without inaccuracy which may caused by the difference between the pressure in the inner vessel and the pressure in the outer atmosphere.

The principle of the method is described hereinafter. The composition of the melt 66 can be obtained by measuring the weight of the melt 66 since the initial weight of the melt, that is, the weight of the gallium in the crucible 34 before the synthesis can be known in the same way. In the measurement of the weight of the melt 66, it is necessary to remove the influence caused by the pressure difference.

The above description is represented by the following formulae:

$$W_1 = w_1 - \Delta P \times \pi \times R_1^2 \qquad (1)$$

$$W_2 = w_2 + \Delta P \times \pi \times R_2^2 \qquad (2)$$

where $\Delta P$ is the pressure difference, $R_1$ is the radius of the lower shaft 30, $R_2$ is the radius of the upper shaft 36, $w_1$ is the measured weight of the GaAs melt 66 and the tare measured by the lower load cell 58, $W_1$ is a true weight of the melt and the tare, $W_2$ is the measured weight of the growing crystal and the tare measured by the upper load cell 56, and $w_2$ is a true weight of the growing crystal and the tare.

Formulae (1) and (2) are rewritten as follows:

$$\begin{aligned}\pi \times \Delta P &= (w_1 - W_1)/R_1^2 \qquad (3)\\ &= (W_2 - w_2)/R_2^2\end{aligned}$$

$$w_1 = W_1 + (W_2 - w_2) \times R_1^2/R_2^2 \qquad (4)$$

In formula (4), $R_1$ and $R_2$ are substituted as the following formula:

$$R_1 = k \times R_2 \qquad (5)$$

where k is a constant. Therefore, $$w_1 = W_1 + (W_2 - w_2) \times k^2 \qquad (6)$$

Since $w_2$ was constant before the seeding procedure is begun, $$w_1 = W_1 + k^2 \times W_2 - c \qquad (7)$$

where c is a constant.

Accordingly, with reference to formula (7), accurate weight $w_1$ of the melt 66 and the tare can be calculated from $W_1$ and $W_2$ during the synthesis procedure.

Therefore, it is possible to detect exactly from $w_1$ estimate, whether the composition ratio has become stoichiometric while the temperature of the As-pressure controlling furnace 44 is controlled. Once the composition ratio has become suitable, the condition of the furnace 44 is kept constant. Then, the seeding and growth procedure is begun.

The composition ratio of the growing single crystal can be controlled accurately and automatically by keeping the temperature of the furnace 44 constant during the growth process.

EXAMPLE 1

An experiment for obtaining a single crystal was done with the above apparatus keeping the pulling-up speed of the upper shaft 36 at 5 mm/hour, the rotation speed of the upper shaft 36 at 5 r.p.m., and the rotation speed of the lower shaft 30 at 5 r.p.m.

The synthesis process of the GaAs melt was detected by the double load cell system as described above and the saturation of the reaction was recognised within the accuracy of 0.1% of 3 kg GaAs melt. The produced single crystal was of a 80 mm diameter and of a 100 mm length. The single crystal was of high quality and highly uniform.

Second Embodiment

Figure 3:
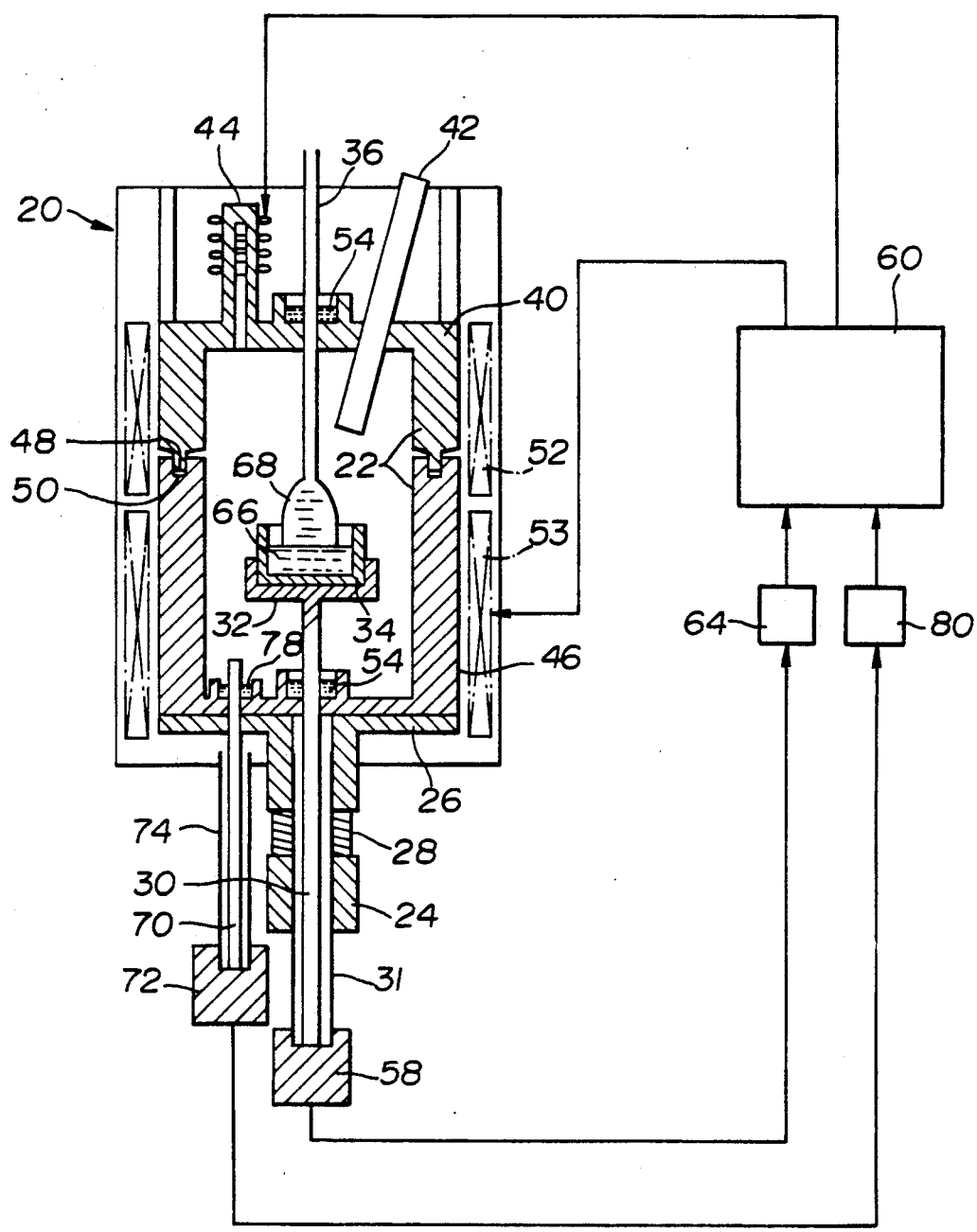
FIG. 3 is a side elevation showing an apparatus of a second embodiment of the present invention.

FIG. 3 depicts an apparatus used for growth of a single crystal of a dissociative compound semiconductor according to a second embodiment of the present invention. In FIG. 3, the same numerals are attached to the same elements as in FIG. 2, so the description of the elements is omitted.

The upper shaft 36, which also penetrates air-tightly the outer and inner vessels 20 and 22 in the second embodiment, however, without the sheath 38 and is not connected to the load cell 56.

A through-hole is formed so as to penetrate through the bottom of the lower vessel portion 46, the flange portion 26 of the pushing-up shaft 24, and the bottom of the outer vessel 20. A detecting bar 70 for detecting the difference between the interior pressure of the inner vessel 22 and the atmosphere pressure is inserted in the through hole, so that the upper end of the bar 70 extends into the inside of the inner vessel 22 and the lower end of the bar 70 is connected to a second load cell 72. The housing of the second load cell 72 is linked to the outer vessel 20 with a sheath 74 in which the detecting bar 70 is inserted.

On the bottom of the lower vessel portion 46, a seal 78 is formed so as to make the detecting bar 70 air-tight and movable freely in a vertical direction as with the sealing 54.

The second load cell 72 is connected to the computer 60 via an A/D converter 80. The output signal of the load cell 72 is transmitted to the A/D converter 80. converted to a digital signal by the A/D converter 80.

The digital signals from the A/D converter 80 and the A/D converter 62 are received by the computer 60 which calculates the weight of the GaAs melt 66 in the crucible 34. The computer 60 controls the power of the furnace 44 so as to control the composition of the melt 66. In the second embodiment, the computer 60 further controls the power of the lower heater 53 so as to control the growing crystal diameter.

With such construction, gallium is placed in the crucible 34 and solid arsenic is placed on the bottom of the lower vessel portion 46. The whole apparatus is then evacuated. The joint portion 48 is made tight by pushing up the lower vessel portion 46 so as to make inner vessel 22 isolated from the outer atmosphere.

Then, the lower heater 53 and the upper heater 52 are turned on to increase the temperature to vaporize the arsenic. At the same time, the temperature of the furnace 44 is adjusted so that the inner vessel is filled with arsenic gas at a prescribed pressure, while the outer vessel 20 is filled with an inert gas at a prescribed pressure. Arsenic gas reacts with gallium in the crucible 34, thereby GaAs melt 66 is synthesized in the crucible 34.

During the synthesis process, the computer 60 calculates an accurate weight of the GaAs melt 66 on the basis of the output signals of the first and second load cells 58 and 72. The temperature of the As-pressure controlling furnace is adjusted so that the melt 66 has a suitable weight, that means a stoichiometric composition. A GaAs seed fixed at the lower end of the upper shaft 36 is then dipped into the melt 66. The upper shaft 36 is pulled upward with rotation about its axis. Consequently, a single crystal 68 of stoichiometric composition of GaAs can be obtained.

In addition, during pulling the upper shaft 36, the first load cell 58 connected to the lower shaft 30 detects the change of the weight of the melt 66. Since the true weight of the melt 66 before the crystal growth always equals to a sum of remained weight of the melt 66 and the weight of the growing crystal 68, the accurate weight and the accurate diameter of the growing crystal 68 is calculated by the computer 60. The computer 60 adjusts the heater 53 so as to control the diameter of the growing single crystal on the basis of the estimate of the crystal weight.

With such a method, the disadvantage of the conventional method, that is, the inability to detect the composition of the GaAs melt 66, is solved, so that the composition of the growing single crystal of compound semiconductor is accurately controlled. Furthermore, the weight of the melt 66 can be measured without inaccuracy, which may caused by the pressure difference.

Furthermore, another disadvantage of the conventional method, that is, the inaccuracy in the measurement of the weight of the growing crystal caused by the difference between the pressure in the inner vessel 22 and the pressure in the atmosphere, is solved, so that the diameter of the growing single crystal of the compound semiconductor is accurately controlled.

Additionally, since the detecting bar 70 does not need to rotate about the axis thereof neither to move vertically, the structure to disposed the detecting bar 70 can be simplified.

The principle of the method is described hereinafter. The composition of the melt 66 can be obtained by measurement of the weight of the melt 66 since the initial weight of the melt, that is, the weight of the gallium in the crucible 34 without the arsenic component is known. In the measurement of the weight of the melt 66, it is necessary to remove the influence caused by the pressure difference.

The above description is represented in as the following formulae:

$$W_1 = w_1 + \Delta P \times \pi \times R_1^2 \tag{8}$$

$$W_2 = w_2 + \Delta P \times \pi \times R_2^2 \tag{9}$$

where $\Delta P$ is the pressure difference, $R_1$ is the radius of the lower shaft 30, $R_2$ is the radius of the detecting bar 70, $W_1$ is the measured weight of the melt 66 and the tare measured by the first load cell 58, $w_1$ is a true weight of the melt 66 and the tare, $W_2$ is the weight measured by the first load cell 72, and $w_2$ is a true weight on the load cell 72.

Formulae (8) and (9) are rewritten as follows:

$$\begin{aligned} \pi \times \Delta P &= (W_2 - w_2)/R_2^2 \\ &= (W_1 - w_1)/R_1^2 \end{aligned} \tag{10}$$

$$w_1 = W_1 - (W_2 - w_2) \times R_1^2/R_2^2 \tag{11}$$

In formula (11), $R_1$ and $R_2$ are substituted as the following formula:

$$R_1 = k_1 \times R_2 \tag{12}$$

where $k_1$ is a constant. Therefore, $$w_1 = W_1 - (W_2 - w_2) \times k_1^2 \tag{13}$$

$$w_1 = W_1 - k_1^2 \times W_2 + C_1 \tag{14}$$

where $c_1$ is a constant.

Accordingly, with reference to formula (14), accurate weight $w_1$ of the melt 66 and the tare can be calculated from $w_1$ and $W_2$.

It is possible to detect exactly whether the composition ratio has become stoichiometric before the seeding procedure. Once the composition ratio has become suitable, the condition of the furnace 44 is kept constant so as to keep the composition stoichiometric. Then, the seeding and growth procedure is begun.

On the basis of the estimate of the weight $w_1$, the diameter of the growing single crystal can be controlled accurately and automatically by means of the computer 60 to control the power of the heater 53.

In the above construction and FIG. 3, the detecting bar 70 is provided at the bottom of the inner vessel 22; and the second load cell 72 is provided beneath the vessel. However, the detecting bar 70 can be installed at the top of the inner vessel 22; and the second load cell 72 can be equipped above the vessel.

In that case, $w_1$ is calculated as follows:

$$w_1 = W_1 + (W_2 - w_2) \times k_1^2 \quad (15)$$

$$w_1 = W_1 + k_1^2 \times W_2 + C_2 \quad (16)$$

where $c_2$ is a constant.

EXAMPLE 2

An experiment for obtaining the single crystal was done with the above apparatus shown in FIG. 3 with the pulling-up speed of the upper shaft 36 at 5 mm/hour, the rotation speed of the upper shaft 36 at 5 r.p.m., and the rotation speed of the lower shaft 30 at 5 r.p.m..

The synthesis process of the GaAs melt was detected by the double load cell system as described above and the saturation of the reaction was recognised within the accuracy of 0.1% of 3 kg GaAs melt. The produced single crystal was of a 80 mm diameter and of a 100 mm length. The single crystal was of high quality and highly uniform. The deviation of the crystal diameter is small, in a range of ±1 mm.

What is claimed is:

1. A method for monocrystaline growth of dissociative compound semiconductor, the method including the steps of:
    (a) preparing a first volatile component material and second material of the dissociative compound semiconductor, the first material being placed on the bottom of an air-tight vessel, the second material being contained in a crucible in the air-tight vessel, the crucible supported by a lower shaft extending from the inside to the outside of the air-tight vessel;
    (b) heating the first material for evaporating the first material to make the first material react with the second material in the crucible, thereby synthesizing the dissociative compound semiconductor in the crucible; and
    (c) pulling up a single crystal from said melt by an upper shaft, the upper shaft extending from inside to outside of the air-tight vessel, thereby growing the single crystal; said method characterized in that said pulling-up process comprises the steps of, after said heating step:
    (d) measuring the weight of the melt in said crucible, the weight of the melt being influenced by a difference between the interior pressure of the air-tight vessel and a pressure outside of the air-tight vessel;
    (e) correcting the measured weight of the melt for the error due to the pressure difference, thereby obtaining an accurate data of the weight of the melt; and
    (f) controlling at least one of a composition and a diameter of the growing crystal on the basis of said weight data of the melt.

2. A method according to claim 1, wherein said controlling step comprises controlling a furnace, the furnace being adequate to adjust the interior pressure of said air-tight vessel, thereby controlling the composition of the growing crystal.

3. A method according to claim 2, wherein said upper shaft and said lower shaft are of circular cross sections, a first load cell being connected to the lower shaft, a second load cell being connected to the upper shaft, said measuring step being done by the first load cell.

4. A method according to claim 3, wherein said second load cell detects the weight of the growing crystal, the weight of the crystal being influenced by a difference between the interior pressure of the air-tight vessel and a pressure outside of the air-tight vessel.

5. A method according to claim 2, wherein a detecting bar penetrates air-tightly the wall of the air-tight vessels, a first load cell being connected to the lower shaft, a second load cell being connected to the detecting bar, said measuring step being done by the first load cell.

6. A method according to claim 5, wherein said second load cell detects the weight supported by the detecting bar, the weight supported by the detecting bar being influenced by a difference between the interior pressure of the air-tight vessel and a pressure outside of the air-tight vessel.

7. A method according to claim 6, wherein said controlling step further comprises controlling a heating means, the heating means being adequate to adjust the temperature of the melt in said crucible, thereby controlling the diameter of the growing crystal.

8. A method according to claim 1, wherein said controlling step comprises controlling a heating means, the heating means being adequate to adjust the temperature of the melt in said crucible, thereby controlling the diameter of the growing crystal.

9. A method according to claim 2, wherein said controlling step further comprises controlling a heating means, the heating means being adequate to adjust the temperature of the melt in said crucible, thereby controlling the diameter of the growing crystal.

10. A method according to claim 9, wherein said controlling step further comprises calculating of a weight estimate of the growing crystal on the basis of the weight data of the melt, said heating means controlled on the basis of the weight data of the growing crystal.

11. An apparatus for monocrystaline growth of dissociative compound semiconductor, the apparatus comprising:
    (a) an outer air-tight vessel having a top and bottom wall;
    (b) an inner air-tight vessel placed in the outer vessel, the inner vessel having a top and bottom wall;
    (c) a furnace installed on the inner vessel for controlling pressure of a gas as a first volatile component material of the dissociative compound semiconductor;

(d) a lower shaft of a circular cross section, the lower shaft having an axis in a vertical direction, the lower shaft being movable in a vertical direction and rotatable about the axis thereof, the lower shaft penetrating air-tightly the bottom walls of the outer and inner vessels in a vertical direction;

(e) a crucible for containing a second component material of the dissociative compound semiconductor in which a melt of the dissociative compound is synthesized by reaction with said gas of said first material, the crucible disposed in the inner vessel and supported by the lower shaft;

(f) heating means being adequate to give a desirable temperature distribution of the inner vessel;

(g) an upper shaft for pulling a single crystal upward from said melt of the dissociative compound, thereby growing the single crystal, the upper shaft being of a circular cross section having an axis in a vertical direction, the upper shaft being movable in a vertical direction and rotatable about the axis thereof, the upper shaft penetrating air-tightly the top walls of the outer and inner vessels in a vertical direction above the crucible;

(h) a first load cell disposed on the outer vessel for detecting the weight of said melt in said crucible, the weight of said melt being influenced by a difference between the interior pressure of the inner vessel and a pressure outside of the inner vessel; and (i) a second load cell disposed on the outer vessel for correcting the measured weight of the melt in the crucible for the error due to the pressure difference.

12. An apparatus according to claim 11, wherein said first load cell being connected to the lower shaft, said second load cell being connected to the upper shaft.

13. An apparatus according to claim 12, wherein said second load cell detects the weight of the growing crystal, the weight of the crystal being influenced by a difference between the interior pressure of the inner vessel and a pressure outside of the inner vessel.

14. An apparatus according to claim 11, wherein said apparatus further comprises a detecting bar penetrating air-tightly the wall of the inner vessel, said first load cell being connected to the lower shaft, said second load cell being connected to the detecting bar.

15. An apparatus according to claim 14, wherein said second load cell detects the weight supported by the detecting bar, the weight supported by the detecting bar being influenced by a difference between the interior pressure of the inner vessel and a pressure outside of the inner vessel.

16. A method according to claim 1, wherein a gas in the air-tight vessel includes the first volatile component material of the dissociative compound semiconductor.

17. An apparatus according to claim 11, wherein a gas in the air-tight vessel includes the first volatile component material of the dissociative compound semiconductor.

* * * * *